(12) United States Patent
Sandhu et al.

(10) Patent No.: US 8,049,514 B2
(45) Date of Patent: Nov. 1, 2011

(54) INTEGRATED CIRCUIT INSPECTION SYSTEM

(75) Inventors: Gurtej S. Sandhu, Boise, ID (US); Neal R. Rueger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/705,349

(22) Filed: Feb. 12, 2010

(65) Prior Publication Data
US 2010/0141265 A1 Jun. 10, 2010

Related U.S. Application Data

(62) Division of application No. 11/216,541, filed on Aug. 31, 2005, now Pat. No. 7,662,648.

(51) Int. Cl.
*G01R 31/02* (2006.01)
(52) U.S. Cl. ........................................ 324/537
(58) Field of Classification Search ........................ None
See application file for complete search history.

(56) References Cited

U.S. PATENT DOCUMENTS

| | | | |
|---|---|---|---|
| 4,358,338 A | 11/1982 | Downey et al. |
| 4,793,895 A | 12/1988 | Kaanta et al. |
| 4,794,646 A | 12/1988 | Takeuchi et al. |
| 4,812,756 A | 3/1989 | Curtis et al. |
| 4,878,017 A | 10/1989 | Williams |
| 4,902,631 A | 2/1990 | Downey et al. |
| 5,057,689 A | 10/1991 | Nomura et al. |
| 5,109,430 A | 4/1992 | Nishihara et al. |
| 5,151,584 A | 9/1992 | Ebbing et al. |
| 5,173,149 A | 12/1992 | Nojiri et al. |
| 5,198,072 A | 3/1993 | Gabriel |
| 5,326,428 A | 7/1994 | Farnworth et al. |
| 5,362,356 A | 11/1994 | Schoenborn |
| 5,458,732 A | 10/1995 | Butler et al. |
| 5,459,082 A | 10/1995 | Jeong |
| 5,489,544 A | 2/1996 | Rajeevakumar |
| 5,494,841 A | 2/1996 | Dennison et al. |
| 5,498,974 A | 3/1996 | Verkuil et al. |
| 5,501,766 A | 3/1996 | Barbee et al. |
| 5,504,328 A | 4/1996 | Bonser |
| 5,505,816 A | 4/1996 | Barnes et al. |

(Continued)

FOREIGN PATENT DOCUMENTS

GB 2398426 8/2006

(Continued)

OTHER PUBLICATIONS

Kwasnick, Robert F., et al., "Buried-Oxide Isolation with Etch-Stop (BOXES)", *IEEE Electron Device Letters*, vol. 9, No. 2, (Feb. 1988), 62-64.

(Continued)

*Primary Examiner* — Paresh Patel
(74) *Attorney, Agent, or Firm* — Schwegman, Lundberg & Woessner, P.A.

(57) ABSTRACT

Methods and systems that include a nanotube used as an emitter in the testing and fabrication of integrated circuits. The nanotube emits a signal to a substrate. Based on the signal or the electrical properties, e.g., current induced in the substrate by the signal, the region of the substrate is characterized. The characterization includes topology of the region of the substrate such as determining whether a recess in the substrate has a proper depth or other dimensions or characteristics of the substrate.

16 Claims, 4 Drawing Sheets

U.S. PATENT DOCUMENTS

| | | |
|---|---|---|
| 5,554,557 A | 9/1996 | Koh |
| 5,555,319 A | 9/1996 | Tsubusaki et al. |
| 5,573,624 A | 11/1996 | Barbee et al. |
| 5,595,928 A | 1/1997 | Lu et al. |
| 5,612,558 A | 3/1997 | Harshfield |
| 5,639,685 A | 6/1997 | Zahurak et al. |
| 5,641,960 A | 6/1997 | Okubo |
| 5,659,172 A | 8/1997 | Wagner et al. |
| 5,665,166 A | 9/1997 | Deguchi et al. |
| 5,700,349 A | 12/1997 | Tsukamoto et al. |
| 5,702,956 A | 12/1997 | Ying et al. |
| 5,710,067 A | 1/1998 | Foote et al. |
| 5,750,990 A | 5/1998 | Mizuno et al. |
| 5,757,198 A | 5/1998 | Shida et al. |
| 5,777,327 A | 7/1998 | Mizuno |
| 5,788,801 A | 8/1998 | Barbee et al. |
| 5,869,876 A | 2/1999 | Ishio et al. |
| 5,953,585 A | 9/1999 | Miyaguchi |
| 5,986,263 A | 11/1999 | Hiroi et al. |
| 6,005,246 A | 12/1999 | Kitamura et al. |
| 6,011,404 A | 1/2000 | Ma et al. |
| 6,048,763 A | 4/2000 | Doan et al. |
| 6,067,153 A | 5/2000 | Mizuno |
| 6,072,313 A | 6/2000 | Li et al. |
| 6,087,615 A | 7/2000 | Schork et al. |
| 6,091,845 A | 7/2000 | Pierrat et al. |
| 6,097,196 A | 8/2000 | Verkuil et al. |
| 6,114,681 A | 9/2000 | Komatsu |
| 6,124,140 A | 9/2000 | Do et al. |
| 6,127,237 A | 10/2000 | Tsuchiaki |
| 6,157,451 A | 12/2000 | Mizuno et al. |
| 6,174,407 B1 | 1/2001 | Johnson et al. |
| 6,175,417 B1 | 1/2001 | Do et al. |
| 6,197,116 B1 | 3/2001 | Kosugi |
| 6,256,094 B1 | 7/2001 | Eyolfson et al. |
| 6,259,520 B1 | 7/2001 | Zeimantz |
| 6,265,304 B1 | 7/2001 | Campbell |
| 6,303,044 B1 | 10/2001 | Koemtzopoulos et al. |
| 6,326,794 B1 | 12/2001 | Lundquist et al. |
| 6,373,566 B2 | 4/2002 | Zeimantz |
| 6,383,825 B1 | 5/2002 | Farnworth et al. |
| 6,417,015 B2 | 7/2002 | Nuttall et al. |
| 6,424,733 B2 | 7/2002 | Lanley |
| 6,441,634 B1 | 8/2002 | Browning et al. |
| 6,452,677 B1 | 9/2002 | Do et al. |
| 6,455,847 B1 | 9/2002 | Yedur et al. |
| 6,517,669 B2 | 2/2003 | Chapman et al. |
| 6,562,187 B2 | 5/2003 | Winniczek |
| 6,613,590 B2 | 9/2003 | Simmons |
| 6,677,246 B2 | 1/2004 | Scanlan et al. |
| 6,730,444 B2 | 5/2004 | Bowes |
| 6,809,534 B2 * | 10/2004 | Yamada .................... 324/754.22 |
| 6,813,534 B2 | 11/2004 | Sui et al. |
| 6,844,205 B2 | 1/2005 | Chapman |
| 6,859,760 B2 | 2/2005 | Dorough |
| 6,861,362 B2 | 3/2005 | Ko et al. |
| 6,888,159 B2 | 5/2005 | Farnworth et al. |
| 6,890,775 B2 | 5/2005 | Simmons |
| 6,895,661 B1 | 5/2005 | Gamel et al. |
| 6,927,589 B2 | 8/2005 | Wark |
| 6,944,839 B2 | 9/2005 | Chevallier et al. |
| 6,974,709 B2 | 12/2005 | Breitschwerdt et al. |
| 6,979,593 B2 | 12/2005 | Kawakami et al. |
| 6,983,536 B2 | 1/2006 | Farnworth et al. |
| 7,005,660 B2 | 2/2006 | Honda et al. |
| 7,023,002 B2 | 4/2006 | Nagaseki et al. |
| 7,047,100 B2 | 5/2006 | Kitamoto et al. |
| 7,048,837 B2 | 5/2006 | Somekh et al. |
| 7,262,555 B2 | 8/2007 | Rueger et al. |
| 7,319,336 B2 * | 1/2008 | Baur et al. ................ 324/750.19 |
| 7,393,699 B2 * | 7/2008 | Tran ................................ 438/1 |
| 7,662,648 B2 | 2/2010 | Sandhu |
| 2001/0051437 A1 | 12/2001 | Cruise |
| 2004/0072994 A1 | 4/2004 | Herr et al. |
| 2005/0029227 A1 | 2/2005 | Chapman |
| 2005/0077527 A1 | 4/2005 | Lee |
| 2005/0191768 A1 | 9/2005 | Yoon et al. |
| 2005/0239223 A1 | 10/2005 | Mantz et al. |
| 2006/0255344 A1 | 11/2006 | Choi et al. |
| 2008/0038894 A1 | 2/2008 | Rueger et al. |
| 2008/0251723 A1 | 10/2008 | Ward et al. |
| 2008/0287030 A1 | 11/2008 | Kim et al. |

FOREIGN PATENT DOCUMENTS

| | | |
|---|---|---|
| JP | 3-74843 | 3/1991 |
| JP | 05251398 | 9/1993 |
| JP | 07086383 | 3/1995 |

OTHER PUBLICATIONS

Subbanna, S., et al., "A Novel Borderless Contact/Interconnect Technology Using Aluminum Oxide Etch Stop for High Performance SRAM and Logic", *IEEE*, (1993), 17.3.1-17.3.4.

* cited by examiner

INTEGRATED CIRCUIT INSPECTION SYSTEM

PRIORITY AND RELATED APPLICATIONS

This application is a Divisional of U.S. patent application Ser. No. 11/216,541 filed Aug. 31, 2005 now U.S. Pat. No. 7,662,648, which is incorporated in its entirety herein by reference.

FIELD OF THE INVENTION

This invention pertains to integrated circuit technology, and more particularly to inspection systems and methods.

BACKGROUND OF THE INVENTION

As integrated circuits become more dense it is necessary to decrease the dimensions of integrated circuit components. Small dimensions create the necessity to test components during fabrication to reduce failure in components. Components are fabricated on different levels of a substrate. The different levels are insulated from each other. Interconnects are formed through the insulators to components on different levels to form a working integrated circuit. This can be accomplished by etching holes in the insulating layers to connect one layer to another. In the art of integrated circuit manufacturing, these etched holes are referred to as contacts or vias.

A long standing problem in the art of fabricating integrated circuits is that of completing a process step and not knowing whether the process step completed successfully. This problem is further amplified by the smaller material dimensions. Some methods use light sources to view the etched holes but these methods have limited resolution in narrow holes for incompletely etched insulating film remaining at the bottom of the hole. If the step did not complete successfully, and the processing of the integrated circuit continues, then it is likely that at the end of the fabrication process the circuit will not work as designed. Thus, continued processing after a failed process step results in wasting the costs of processing after the failed step.

For these and other reasons, there is a need for the present invention.

SUMMARY OF THE INVENTION

The present invention includes methods and systems that include a nanotube used as an emitter in the testing and fabrication of integrated circuits. The nanotube operates as an electron emitter to generate energetic electrons that are used to inspect an integrated circuit structure, in an embodiment.

One method includes providing a nanotube emitter, using the nanotube emitter to send a signal to a substrate, and characterizing a region of the substrate based on the signal. This method is used to determine the topology of the region of the substrate such as determining whether a recess in the substrate has a proper depth or other dimensions/characteristics of the substrate. In an example, the substrate and nanotube are positioned relative to each other such that a dielectric layer with an etched recess is in a path of the signal emitted by the nanotube. Dielectric layers include one of an oxide, a nitride, borophosphosilicate, silicon-dioxides, silicon-nitrides, and tetra-ethyl-ortho-silicates. The nanotube has a small diameter tip, typically on the order of one to ten Angstroms. The nanotube is a carbon nanotube in an embodiment. The nanotube is a boron carbon nitride nanotube in an embodiment. The nanotube is a boron nitride nanotube in an embodiment. In an embodiment, the method or system of the present invention determines whether a via is completely formed by sensing the current emitted from the nanotube tip and comparing the sensed current to an expected value when the nanotube is sending its signal into a completely formed via. In an embodiment, sensing includes sensing a rate of change of the current in the substrate.

An embodiment of the method includes dry etching a substrate. In an embodiment, the dry etching creates a plurality of recesses in an insulating layer at the top of the substrate. The nanotube is moved to align with the recess such that the nanotube emits its signal into the recess and induces a current in the substrate. The current in the substrate is sensed to determine the characteristics of the recess. If the recess is not completely etched then the nanotube creates a further etching to clean out the bottom of the recess in an embodiment. In an embodiment, the nanotube generates localized plasma by emitting a high energy signal. The plasma can be created from a rare gas adjacent the nanotube. The plasma includes ions that are physically driven into the bottom of the recess to further etch the incompletely etched recess. In an embodiment, the current through the substrate is simultaneously sensed. When the further etching reaches the desired depth of the recess the current in the substrate reaches a desired value, typically its maximum. At this point the further etching by the nanotube is stopped.

The systems include a nanotube or a plurality of individual nanotubes. The plurality of nanotubes is individually actuatable in an embodiment. The nanotube includes any of the features described above with regard to the method. A system for testing integrated circuit substrates includes a nanotube emitter assembly adapted to transmit an electrical signal to a substrate, and a current sensor electrically coupled to the nanotube emitter assembly. The current sensor is adapted to sense the current induced in the substrate by the electrical signal transmitted by the nanotube emitter assembly. In an embodiment, the nanotube emitter assembly includes a carbon nanotube. In an embodiment, the carbon nanotube is a boron carbon nitride nanotube. In an embodiment, the carbon nanotube is a single walled nanotube. In an embodiment, the nanotube emitter assembly includes a boron nitride nanotube. In an embodiment, the nanotube emitter assembly includes an aluminum nitride nanotube. The system further includes a controller adapted to spatial position the nanotube relative to the substrate. The current sensor senses the charge/discharge time of the current input into the substrate by the nanotube emitter.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined by the appended claims.

Figure 1:
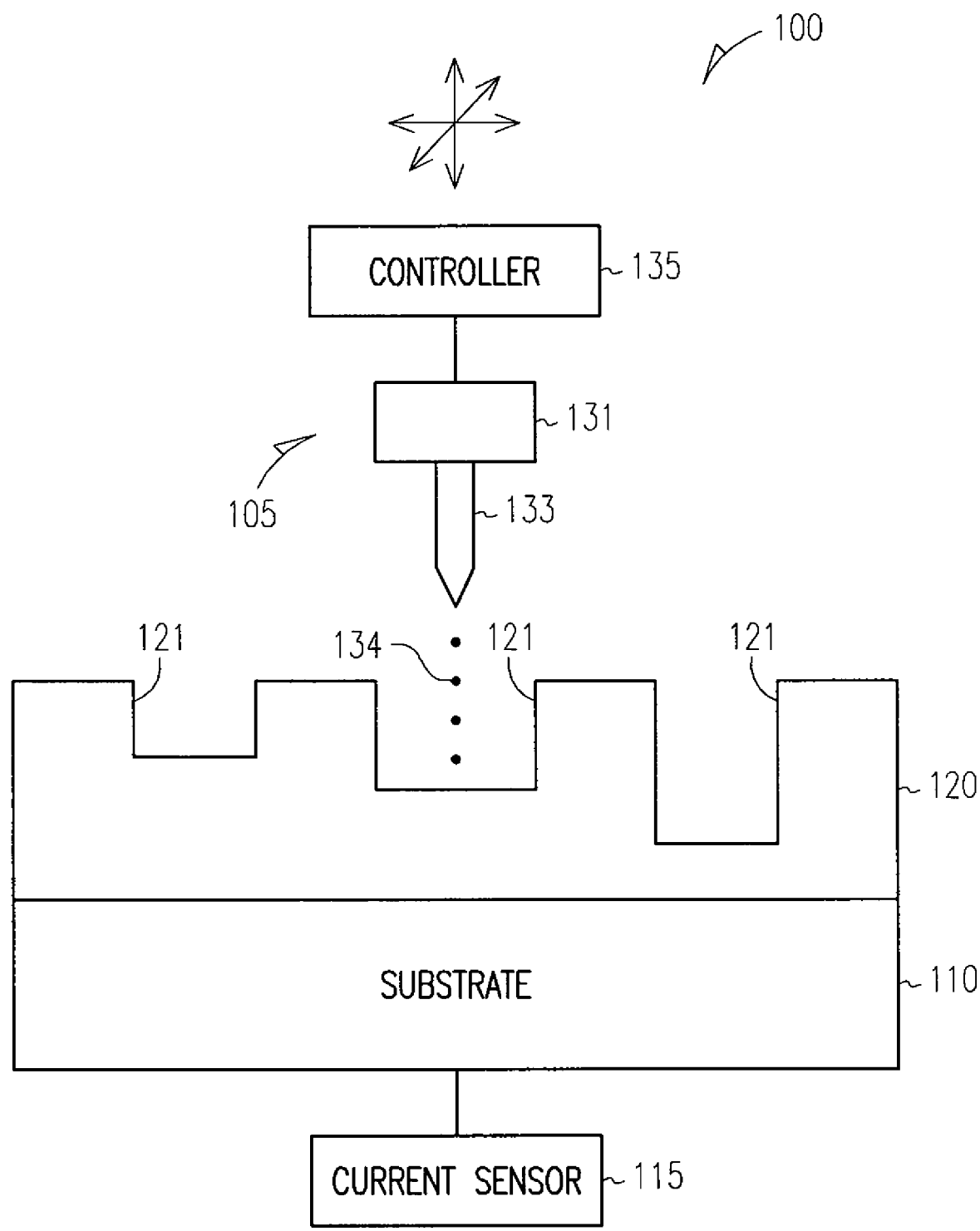
FIG. 1 is a block diagram of a system in accordance with an embodiment of the present invention in which the contact dielectric etching is incomplete.
Figure 2:
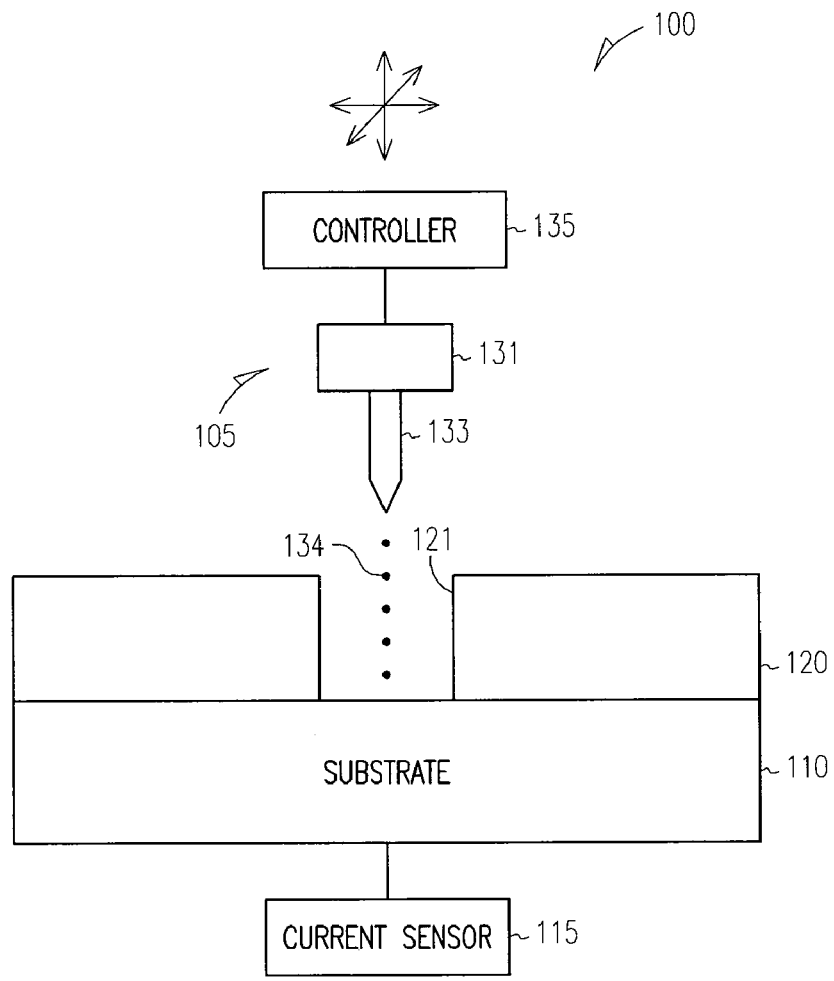
FIG. 2 is a block diagram of a system in accordance with an embodiment of the present invention in which the contact dielectric etching is complete.

FIG. 1 shows an inspection system 100 having an inspection transmitter 105 and an inspection current sensor 115 in operation with a workpiece 110. Workpiece 110, in an embodiment, is a substrate for an integrated circuit. The substrate 110 includes a base, such as a wafer, and may include a plurality of integrated circuit layers formed on the base layer. Substrate 110 includes an insulating layer 120. The insulating layer is formed, in various embodiments, from at least one of a protective oxides, a sacrificial oxides, nitrides, borophosphosilicate glasses (BPSG), silicon-dioxides, silicon-nitrides, and tetra-ethyl-ortho-silicates (TEOS). The insulating layer 120 includes a plurality of recesses 121 therein. These recesses are also called vias. These recesses 121 are formed by etching layer 120. In an embodiment, the etching is dry etching, which is a desirable etching process in view of the smaller dimensions of the contact recesses. Dry etching allows the contact recesses to be formed with a width dimension of less than about 90 microns. Width dimensions of less than about 75 microns or about 35 microns are achievable with dry etching. Due to the shrinking dimensions of the vias in an effort to increase the number of devices on a single die, it has become more difficult to control the etch process to ensure that each via is adequately and completely etched. Each of the three recesses 121 of FIG. 1 show three different depths of incomplete formation of the recesses 121. FIG. 2, in contrast to FIG. 1, shows a single recess 121 that is completely etched to the substrate 110. Complete etching of the recess is critical to operation of a completed integrated circuit, such as a processor or a memory device. The recesses are filled or plugged with a conductive material to form electrical connections between layers of circuit devices formed on the substrate. The recesses may further act as a conductive line within a single layer as a circuit layout may require. Examples of conductive material include metals such as aluminum, copper, or alloys thereof.

The inspection system 100 operates to examine the substrate 110 to determine the topology of the surface of substrate 110. In an embodiment, the system determines the extent and/or completeness of the etching of layer 120 to form a recess 121. An emitter support 131 includes a nanotube emitter 133 that, due its nano-dimensioned tip, emits an electron stream 134 toward the substrate surface and in particular into a recess 121. Nanotubes are suited for the purpose of inspecting narrow dimension recesses used in integrated circuits. The nanotube is a carbon nanotube in an embodiment. One example of a carbon nanotube is a boron carbon nanotube. A further example of a nanotube is a boron nitride nanotube. A further example of a nanotube is an aluminum nitride nanotube. A further example is a doped nanotube. The doped nanotube is electrostatically doped to form two halves of a single nanotube with each half having a different dopant. This essentially creates a diode configuration. The nanotube emitter 133 includes a tip that provides a high intensity source for electrons. The tip has a width of about ten angstroms in an embodiment to focus the electron stream. Such a nanotube has a field emission of a 2V/mm and can produce current densities on the order of about tenths of amps per square centimeter. These nanotube emitters may produce current densities as high as one amp per square centimeter. In an embodiment, the nanotube is a single walled nanotube ("SWNT") with a diameter of about 1 nm or less and a length greater than about one to three orders of magnitude greater than the diameter. In an embodiment, the SWNT has a diameter of about 3 nm-8 nm. In an embodiment, the SWNT has a current density of greater than or about 2 $MA/cm^2$. In an embodiment, the electric field is greater than three $V/\mu m$.

A controller 135 is connected to the nanotube support 131. The controller 135 operates to control the relative position of the nanotube 133 relative to the substrate 110 and recesses 121. In an embodiment, the controller includes a stepper that sequentially moves the nanotube 133 into alignment with the recesses 121 such that the nanotube 133 directs its electron stream 134 to one recess and then to another recess after completing the testing/evaluation of the prior recess. The controller 135 further includes a voltage source that applies a voltage to the nanotube 133 to create the electron stream 134.

An inspection current sensor 115 is electrically connected to the substrate 110. The current sensor operates to sense current flow from the nanotube 133 through the substrate 110. The current sensor is a circuit capable of sensing current or the rate of change of a current signal. In an embodiment, sensor 115 is an ammeter or a calibrated ammeter. In an embodiment, sensor 115 is a computer system capable of measuring current or the rate of change of a current signal.

Figure 3:
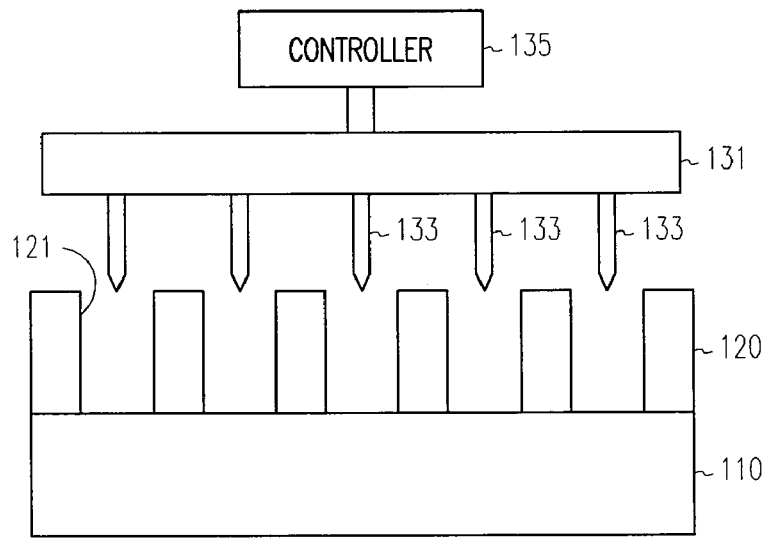
FIG. 3 is a block diagram of a system in accordance with an embodiment of the present invention.

FIG. 3 shows a plurality of nanotubes 133 on the support 131. The nanotubes 133 are driven by the controller 135 such that only selected nanotubes 133 receive a voltage from the controller. That is, the nanotubes 133 are independently addressable by the controller 135. In an embodiment, the nanotubes 133 are positioned such that each recess 121 in a particular layer 120 has a corresponding nanotube. Accordingly, the support 131 need not move to test each recess in the substrate 110. In an embodiment, the plurality of nanotubes is positioned over a complete die such that the controller 135 includes a stepper that moves the support 131 on a die by die basis. In an embodiment, each of the nanotubes 135 are individually actuated by a transistor that selectively supplies power to the respective nanotube.

In operation, the controller 135 aligns the nanotube 133 with a recess 121. The controller 135 moves the support 131 and, hence, nanotube 133 in three dimensions as indicated by the axis shown above controller 135 in FIGS. 1 and 2. In an embodiment, the tip of the nanotube 133 is inserted into the opening at the top of the recess 121. The controller 135 applies a voltage to the nanotube 133 sufficient to cause the nanotube 133 to emit an electron stream 134 into the recess 121. The electron stream 134 creates a current flow in the substrate 110. The current flow will depend on the type of surface that the electron stream 134 contacts. The current stream will encounter greater resistance if the recess is not fully etched (FIG. 1) than if the recess is fully etched (FIG. 2). That is, a fully etched recess 121 (FIG. 2) will have a different current flow than an incompletely etched recess 121 (FIG. 1)

due to the insulating properties of a portion of layer 120 remaining in the recess. In general, the incompletely etched recess will have less current flow than the completely etched recess. The current sensor 115 will sense the current flow in the substrate. Based on the sensed current flow, the inspection system 105 can determine the whether the recess 121 is completely etched. In an embodiment, the recess bottom is defined by a contact made of a conductive material. Accordingly, the contact will conduct the current significantly better than when the bottom of the recess remains covered by a portion of insulating layer 120.

Figure 4:
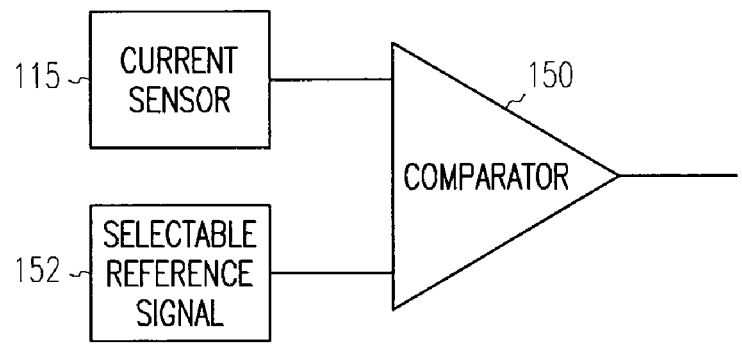
FIG. 4 is a block diagram of a system in accordance with an embodiment of the present invention.

FIG. 4 shows a circuit diagram for determining the completeness of a recess 121. The current sensor 115 generates an output signal to a comparator 150. A selectable reference signal 152 is input into the comparator 150. The reference signal is selected to represent a complete etching of a recess 121. The value of the selectable reference signal depends on the physical parameters of the completed recess 121, such as the final depth of layer 120, the material at the closed bottom of the recess 121, and the material and fabricated layers in the substrate 110. In an example, with the selectable reference signal 152 can have a value of generally equal to just less than the value output from the current sensor 115 when the recess is completely etched. This allows the comparator 150 to output a "one" signal when the recess is completely etched and a "zero" signal when the recess is not completely etched.

Figure 5:
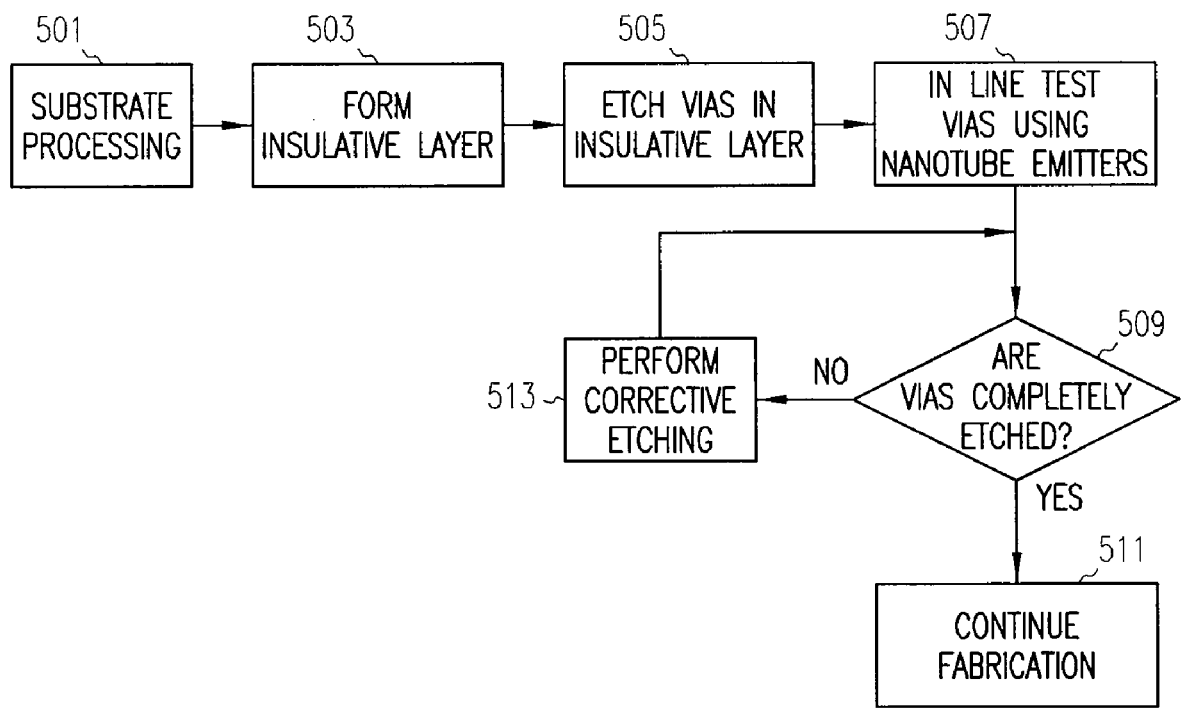
FIG. 5 is a flow chart of a process in accordance with an embodiment of the present invention.

FIG. 5 shows a method 500 according to an embodiment of the present invention. Substrate processing 501 is performed, which includes providing a substrate to a station in a fabrication line. The substrate processing includes cleaning a wafer and may include fabricating various layers on the base wafer. These layers may include integrated circuit devices such as capacitors and transistors. The insulating layer is formed over the substrate, 503. The insulating layer is an interlayer insulating layer that allows further layers of integrated circuit devices to be fabricated on the top surface of the insulating layer without interfering with the operation of the integrated circuit devices formed in the layers below the insulating layer. In this vertical stack of layers of IC devices, it is necessary that the bottom layers be in electrical communication with at least some of the upper layers and/or contacts at the very top layer.

To form the electrical communication lines, recesses 121 are etched into the insulating layer, 505. One form of etching is a wet etching process that uses masks on the insulating layer to pattern layer and solutions of chemical that remove the unmasked portions of the insulating layer. Another form of etching is dry etching. Dry etching does not use solutions on or immerse the substrate in a bath to form the recesses as wet etching does. Dry etching generally uses ion bombardment or a chemical reactive method to form the recesses, e.g., 121 in FIGS. 1-3. Dry etching is typically used where an anisotropic etch is preferred. In an embodiment, the dry etching etches in the vertical direction (i.e., perpendicular to the substrate surface) at a much faster rate than in the horizontal direction. Dry etching produces smaller feature sizes than wet etching. Hence, dry etching is a desirable etching process as the feature sizes continue to shrink in ICs. Examples of dry etching include physical sputtering, plasma etching, and reactive ion etching. Reactive ion etching combines bombardment, a physical etching, with a chemical reaction to etch insulating layer 120 to form recesses 121. Briefly, reactive ion etching introduces an etchant gas in to a low pressure (10-100 mTorr) integrated circuit fabrication chamber. Plasma is created. A reactive species of the etchant gas is generated by the plasma. The reactive species includes both radicals for chemical reaction and ions for physical reaction with the insulating layer. The reactive species are diffused on the masked insulating layer. The reactive species are diffused onto the substrate surface. The physical reaction and chemical reaction occur on the surface and produce a byproduct that is exhausted from the chamber. In one specific example, with the insulating layer being $SiO_2$, a metal resist layer such as Cr, Ni, or Al is patterned on the $SiO_2$ layer. The reactive ion etching gas can be either $CHF_3+O_2$ or $CF_4+H_2$. The reactive ion etching produces recesses having widths less than about 100 nanometers. The reactive ion etching can be used to form recess widths of less than about 90 nanometers.

The recesses are now tested for complete etching using the systems and methods using nanotubes as emitters as described herein in accordance with embodiments of the present invention, 507. The testing is performed inline without removing the substrate from the fabrication equipment or process flow. This improves reliability by testing without adversely effecting throughput of the fabrication process. The testing aligns a nanotube emitter with a recess and transmits an electron beam into the recess. The current in the substrate is measured. A determination whether the vias or recesses are completely etched, 509, by comparing the sensed current in the substrate with an expected value. The expected value is determined experimentally by testing a known substrate architecture with the nanotube emitter inspection system. If the recesses are completely etched, then the substrate continues on to a subsequent fabrication process, 511.

If it is determined that the recesses are not completely etched, then substrate undergoes a corrective etching process, 513. If the mask remains in the substrate, the substrate is returned to the dry etching process and the dry etching is repeated. This repeated dry etching process is desirable if there are a significant number of recesses that require further etching and the further dry etching will not further undesirably etch or damage the completed recesses. As an alternative, the nanotube emitters are used to dry etch only the incompletely etched recesses. A rare gas environment is introduced into the chamber having the substrate and the inspection system 105. The nanotube emitter associated with the incompletely etched recess or via uses its field emission to charge the insulating material remaining in the recess while simultaneously causing electron impact by the rare gas species. That is, the nanotube emitter dry etches the recess in a localized manner. Essentially, this process is a highly localized sputtering in the recess to remove the remaining insulating layer from the bottom of the recess. The field emission for the nanotube emitters is higher than the emission for testing the completeness of the recess. In an embodiment, the current sensed by the current sensor should steadily increase as the insulating material in the recess is removed by the localized dry etching by the nanotube emitter. It is desirable to limit the magnitude of the field emission from the nanotube to selectively remove the insulating material but not remove the material, e.g., contact, at the surface of the substrate. Once the reading at the current sensor reaches the desired value that corresponds to the energy input to the cleared recess by the nanotube as it travels through the substrate (e.g., voltage drop), then the nanotube emitter ends its creation of the localized dry etching.

The value of the current sensed by the current sensor can further be saved in a database that provides the ability to track defects and to analyze the fabrication process. This data analysis is important to the quality of the manufactured material. Variations in production conditions can cause entire lots of product to be discarded, wasting valuable production time and money. Quick data analysis based on the measured signals may avoid wholesale scrapping of chips. The measured signals may be correlated with other fabrication data, which includes at least one of parametric production data, film thickness data, critical dimension data, and changes to any parameter in the fabrication data, and any other data that is relevant to the production process and its condition. This data may be analyzed for trends and other statistically valid measures.

Figure 6:
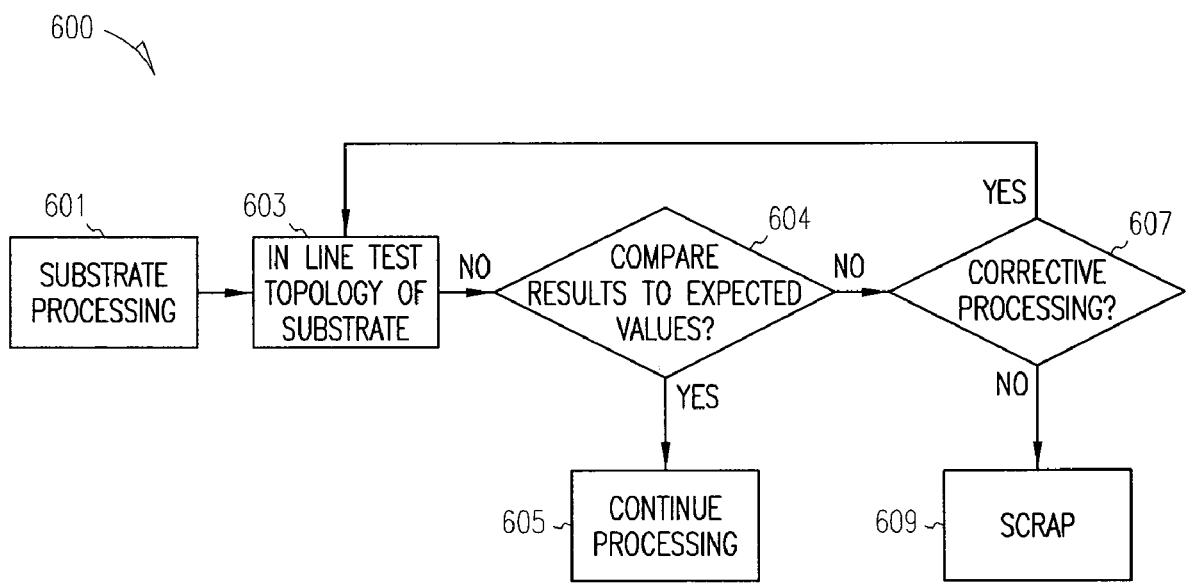
FIG. 6 is a flow chart of a process in accordance with an embodiment of the present invention.

FIG. 6 shows a method 600 according to an embodiment of the present invention. Substrate processing 601 is performed, which includes providing a substrate to a station in a fabrication line. Substrate processing 601, in an embodiment, is the same or similar to substrate processing 501 as described above. Substrate processing 601, in an embodiment, includes transistor fabrication, capacitor fabrication or fabrication of any structure associated with integrated circuit memory. Such structures include wordlines, bitlines, doped regions, field oxides, other insulating layers. The substrate is typically separated into dies. Each die includes an active integrated circuit such as a memory device, processor, logic circuits, or application specific integrated circuits. Memory devices include read only memory, dynamic random access memory, static random access memory, EEPROM, and flash memory. Additionally, the memory device could be a synchronous memory device such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies as known in the art. During any stage of fabrication, the substrate is tested inline to determine whether the top surface of the substrate has the desired topology, 603. This testing is performed using structures and methods as described herein. The topology is tested during intermediate stages of fabrication, e.g., after an individual layer is formed, to precisely determine when and where a defect is formed. This testing is performed as a function of time in an embodiment. Specifically, the nanotube emits a pulse signal to the substrate. The response of the substrate is measured. In an embodiment, the testing includes varying the power in the signal emitted from the nanotube. The response of the substrate is measured. The predicted response of the substrate based on its correct, desired structure and the signal output from the nanotube is stored. The measured results are compared to the stored results, 604. The comparison may be a simple comparator circuit as shown in FIG. 4. In an embodiment, the comparison may be a statistical analysis of the measured value in view of the desired signals. The inline testing may further determine spatial characteristics of the topology. One example, is determining the widths and lengths of features on the substrate. In a further example, the position of structural features of the substrate is determined. For example, the controller 135 (FIGS. 1-3) may move the nanotube 133 laterally across the substrate. The current sensor 115 will sense a current change from the substrate. When the nanotube moves from directing its electron stream from an insulator to a conductor, the current sensed by the current sensor will increase. When the nanotube moves from the conductor to an insulator, the current sensor will detect a drop in current. The movement of the nanotube is correlated to the change in current and a dimension, e.g., length or width, of the conductor is determined. In an example, the conductor is a bit line or a wordline. In an example, the conductor is an electrode for a capacitor.

If the comparison of the measured signals matches the stored values, then the substrate continues fabrication processing, 605, e.g., depositing additional layers, dicing, packaging, etc. However, if the comparison indicates a defect, then the process decides whether corrective processing can be performed on the defect, 607. If the defect is one on which corrective processing can not be performed, then the substrate is scrapped at this point in processing, 609. Scrapping means removing the substrate from further processing so that time and materials are not wasted on a known defective substrate. If corrective processing is available, then the corrective processing is performed, and the substrate is returned to the inline testing, 603. Corrective processing includes the use of the nanotubes to further etch the surface of the substrate to remove some material on a localized, i.e., nanometer, basis.

In a further embodiment of the present invention, the current leaving the nanotube emitter 133 is measured. The current leaving the nanotube will vary according to the material on the substrate surface being impinged by the electron stream emitted by the nanotube. This is based on the field emission properties of the nanotube.

Figure 7:
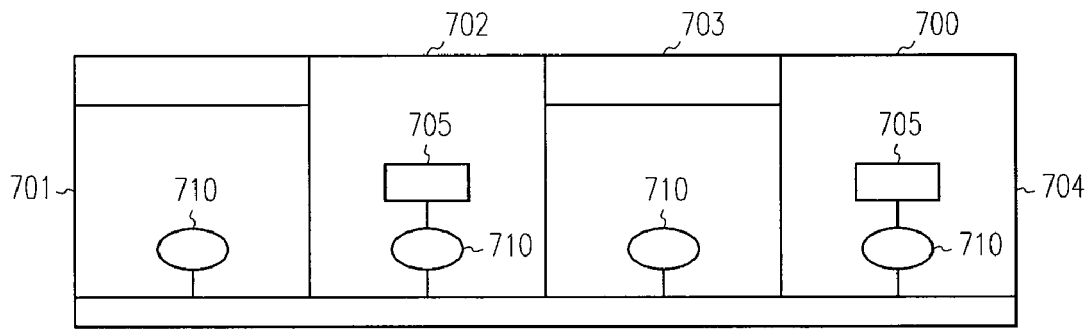
FIG. 7 is an illustration of an in-line measurement system in accordance with an embodiment of the present invention.

FIG. 7 shows an integrated circuit fabrication 700 having four inline chambers 701-704. Chambers 701 and 703 are fabrication chambers that fabricate structures on the substrate 710. Chambers 702 and 704 each include a nanotube inspection system 705 according to the teachings herein. The substrates 705 move between chambers 701-704 by an automated handler that does not remove the substrates from the fabrication line.

Various embodiments of processes and systems for measuring the surface voltage have been described above. Some of these processes and methods can be used in connection with the measurement of a surface voltage of semiconductor substrate 715. Measurement system 700 has the advantage that semiconductor substrate 715 is not removed from plasma etch chamber 705 before making a surface voltage measurement, and therefore reduces the overall manufacturing time for the substrate.

Embodiments of the invention may be implemented in one or a combination of hardware, firmware, and software. Embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disc storage media, optical storage media, flash-memory devices, electrical, optical, acoustical or other form of propagated signals (e.g., carrier waves, infrared signals, digital signals, etc.), and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus, the following claims are hereby incorporated into the detailed description, with each claim standing on its own as a separate preferred embodiment.

What is claimed is:

1. A system for testing integrated circuit substrates, comprising:
   a nanotube emitter assembly to transmit an electrical signal to an integrated circuit substrate; and
   a sensor electrically coupled to the nanotube emitter assembly to sense current associated with the electrical signal and induced through the integrated circuit substrate,
   wherein the nanotube emitter assembly is configured to dry etch insulation material from an incompletely etched recess of the integrated circuit substrate.

2. The system of claim 1, wherein the sensor includes an ammeter.

3. The system of claim 1, wherein the sensor includes a computer to sense the current.

4. The system of claim 1, wherein the sensor includes a computer to sense a rate of change of the current.

5. The system of claim 1, including a controller to characterize the topology of the substrate using a process of sensing the current as sensed current.

6. The system of claim 5, wherein the controller is to compare the sensed current to a reference signal to determine if a recess of the integrated circuit substrate is fully etched.

7. The system of claim 1, wherein the nanotube emitter assembly comprises a carbon nanotube.

8. The system of claim 7, wherein the carbon nanotube comprises a boron carbon nitride nanotube.

9. The system of claim 7, wherein the carbon nanotube comprises a single walled nanotube.

10. The system of claim 1, wherein the nanotube emitter assembly comprises a boron nitride nanotube.

11. The system of claim 1, wherein the nanotube emitter assembly comprises an aluminum nitride nanotube.

12. The system of claim 1, wherein the nanotube emitter assembly comprises a controller to position the nanotube emitter assembly in space relative to the substrate.

13. The system of claim 1, wherein the nanotube emitter assembly comprises a nanotube and a controller, the controller to provide electrical input signals to the nanotube that produce a pulsed electrical output signal from the nanotube.

14. The system of claim 1, wherein the sensor is to sense the charge and/or discharge time of the current.

15. The system of claim 1, wherein the sensor is to measure the current while the substrate is etched.

16. The system of claim 1, wherein the nanotube emitter assembly is to transmit the electrical signal into a recess in a dielectric layer disposed on the substrate, the dielectric layer including at least one of an oxide, a nitride, borophosphosilicate, silicon-dioxides, silicon-nitrides, or tetra-ethyl-orthosilicates.

* * * * *